United States Patent [19]

Brunsvold et al.

[11] Patent Number: 4,828,964
[45] Date of Patent: May 9, 1989

[54] POLYIMIDE FORMULATION FOR FORMING A PATTERNED FILM ON A SUBSTRATE

[75] Inventors: William R. Brunsvold, Poughkeepsie; Willard E. Conley, Cornwall, both of N.Y.; Scott L. Jacobs, Apex, N.C.; George L. Mack, Pleasant Valley, N.Y.; David P. Merritt, Cold Spring, N.Y.; Ann M. Uptmor, Wappingers Falls, N.Y.

[73] Assignee: International Business Machines Corporation, Armonk, N.Y.

[21] Appl. No.: 93,360

[22] Filed: Sep. 4, 1987

Related U.S. Application Data

[63] Continuation-in-part of Ser. No. 767,347, Aug. 20, 1985, abandoned.

[51] Int. Cl.$^4$ .......................... G03C 1/90; G03C 5/16
[52] U.S. Cl. .................................... 430/271; 430/313; 430/311; 430/314; 430/323; 430/324; 528/351; 524/84; 524/93; 524/606; 524/600; 524/110
[58] Field of Search .................. 524/84, 93, 606, 600, 524/110; 528/351; 430/313, 311, 271, 314, 323, 324

[56] References Cited

U.S. PATENT DOCUMENTS

| | | | |
|---|---|---|---|
| 3,856,752 | 12/1974 | Bateman et al. | 524/879 X |
| 4,168,366 | 9/1979 | D'Alelio | 522/164 X |
| 4,362,809 | 12/1982 | Chen et al. | 430/312 |
| 4,370,405 | 1/1983 | O'Toole et al. | 430/313 X |
| 4,433,044 | 2/1984 | Meyer et al. | 430/313 X |
| 4,606,998 | 8/1986 | Clodgo et al. | 430/313 X |

OTHER PUBLICATIONS

Yoshio Homma, Hisao Nozawa, Seiki Harada, "Polyimide Liftoff Technology for High-Density LSI Metallization", *IEEE Transactions on Electron Devices*, vol. ED-28, No. 5, May 1981, pp. 552-556.

*Primary Examiner*—Paul R. Michl
*Assistant Examiner*—Cynthia Hamilton
*Attorney, Agent, or Firm*—Perman & Green

[57] ABSTRACT

A composition for use in a process for the deposition of patterned thin metal films on integrated circuit substrates, the composition comprising an admixture of a thermoplastic polyimide resin and a coumarin dye dissolved in a substituted phenol solvent. Optionally a polar solvent having a boiling point greater than 160° C. and a low boiling organic compound (70°–150° C.) may be incorporated in the composition.

24 Claims, No Drawings

POLYIMIDE FORMULATION FOR FORMING A PATTERNED FILM ON A SUBSTRATE

CROSS REFERENCE TO RELATED APPLICATION

This application is a continuation-in-part of U.S. Ser. No. 767,347, filed Aug. 20, 1985, now abandoned.

BACKGROUND OF THE INVENTION

I. Field of the Invention

This invention relates to an underlay composition for use in the fabrication of integrated circuits, and in particular to a lift-off process involved in such fabrication.

II. The Prior Art

One method used for the manufacture of integrated circuits involves the formation of vacuum deposited thin metal films which are etched in the presence of etch resistant photoresist layers to provide the selected pattern. This, in effect, involves the traditional photoengraving or photolithographic etching technique. However, with the continued miniaturization or semiconductor integrated circuits, to achieve greater component density and smaller units in large scale integrated circuitry, additional processes have been developed wherein photoresist layers are patterned over a substrate, metal is vacuum deposited over the photoresist layer and subsequently the photoresist is removed, leaving fine metal linework or patterns on the substrate.

As an example of such additional processes developed by the art to obtain fine minute resolution is a process wherein a bottom layer or underlay of a non-photosensitive polymeric material is formed on a silicon substrate which may already contain previously patterned layers as well. Then a photoresist composition is deposited on the underlay and is exposed to a selected pattern of radiation such as electron beam or ultraviolet light. Openings are formed in the photoresist layer by development of the radiation exposed portions of the photoresist layer as well as aligned portions of the polymeric underlay. A thin metal film is then deposited on the undeveloped portions of the photoresist layer and on the substrate through the apertures formed in the photoresist and underlay.

Pattern formation of the deposited thin film layer on the substrate is achieved by subsequent removal of the photoresist/underlay composite together with the excess thin film by immersing the substrate in a solvent which dissolves the polymeric underlay. This just described method for the formation of patterned metallic films is referred to in the art as the "lift-off" process, and by such process, lateral widths of thin metallic films are deposited on silicon wafer substrates and spaced in the order of 0.5 mils or less. An example of a prior art teaching of such a lift-off process is contained in U.S. Pat. No. 4,004,044.

Polymeric compositions which are to be used as underlay material must be thermally stable at the temperatures, e.g., 210°–230° C., at which deposition of thin metallic films occurs to avoid decomposition and/or insolubilization of the polymeric underlay. Thermoplastic polyimide polymers may be used as underlay materials because of their high thermal stability, e.g. in excess of 400° C. Polyimides are generally defined as polymers having the repeating imide linkage

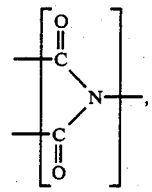

in the main chain and are derived from an aromatic dianhydride such as pyromellitic anhydride and an aliphatic or aromatic diamine.

Thermoplastic polyimides are well known to the art. An example of such material is commercially available and sold under the trademark XU 218 by Ciba-Geigy Corporation of Ardsley, New York. The polyimide is formed by first condensing benzophenonetetracarboxylic dianhydride with 5(6)-amino-1-(4'-aminophenyl)-1,3,3-trimethylindane (DAPI) and then heating at 25° C. until it is fully polymerized. XU 218 is supplied as a solid powder, has a density of 1.2 grams per cubic centimeter and a glass transition temperature (Tg) of 320° C.

Polyimide formulations used as underlay materials may have incorporated therein a radiation absorbing dye to improve linewidth resolution and uniformity in the deposited photoresist imaging layer. Thus, it has been determined that linewidth control problems can arise due to light scattering and reflection from the substrate-underlay interface during exposure of the photoresist imaging layer to radiation such as ultraviolet light. The light scattering and reflection can cause the photoresist to be exposed to an undesirable high dose of ultraviolet light, which in turn leads to undesirable linewidth variation. It has been found by the art, e.g. U.S. Pat. No. 4,362,809 that the light-scattering and reflection phenomenon can be reduced by incorporating in the polyimide composition a radiation absorbant dye. When the imaging source is ultraviolet radiation the dye used is one which will absorb light at a wavelength of 350–500 nanometers (nm), with a maximum absorbance preferably in the 400–500 nm range.

A polyimide solution commercially available from Ciba-Geigy which has been evaluated as an underlay material for use in lift-off processes is composed of a mixture of about 15 percent by weight XU 218 and 5 percent by weight Orasol Yellow 4GN a monoazo dye dissolved in a gamma-butyrolactone solvent. The dye dissolved in a gamma-butyrolactone solvent absorbs light in the 350–500 nm range.

One of the disadvantages to the use of the Orasol 4GN dye is that the dye exhibits marginal thermal stability at 230° C. Deposition of the thin metal films is normally performed at this temperature whereby the dye is vulnerable to decomposition. The outgassing that can result from dye decomposition will cause undesirable dimensional changes or distortion of the deposited metal lines.

A second disadvantage to the use of the Orasol 4GN dye is that high concentrations of dye, e.g. in the order of 5 percent by weight, are required to prevent linewidth variations due to light scattering. The presence of the high dye concentration has been found to materially increase the time necessary to effect lift-off of the polyimide underlay film.

A further disadvantage in the use of the commercially available polyimide formulations is that the presence of high boiling point solvents such as gamma-butyrolactone (b.p. 203° C.) causes "edge pull back" or volume concentration of the film after it is cast on the substrate. Edge pull back results in the formation of a 1 to 2 mm.diameter band of relatively thin (e.g. 1–1.2 microns) film material to form at the edges of the substrate as compared to the thickness of the remainder of the cast film, e.g., about 1.8–2.0 microns, normally applied as the underlay.

During processing of the coated substrates, as by argon sputter cleaning of film surfaces, the heat generated during such processing causes the relatively thin band of polymeric film at the edge of the substrate to be more firmly bonded thereto whereby removal of the underlay with conventional solvents is rendered impossible thereby preventing lift-off of the photoresist layer and the deposited metal layer.

A thermally stable underlay composition that would be thermally stable at temperatures in excess of 230° C., which could be cast on semiconductor substrates without the occurrence of edge pull back and which could be easily and completely removed in lift-off processing would be highly advantageous and much prized by workers in the art.

It is thus an object of the present invention to provide a thermally stable underlay composition that can be used for fabrication of semiconductors at temperatures in excess of 230° C.; which can be readily and completely removed in lift-off processing.

SUMMARY OF THE INVENTION

The present invention fulfills the above-stated objective by providing a composition suitable for use as an underlay in a lift-off process which composition is comprised of a mixture of (a) a thermoplastic polyimide polymer and (b) a coumarin dye having the formula

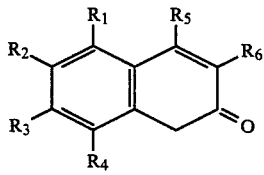

wherein $R_1$, is hydrogen, $R_2$ is hydrogen or an alkyl group having 1 to 4 carbon atoms, $R_3$ is —NHR where R is an alkyl group containing 1 to 4 carbon atoms or $N(C_2H_5)_2$, $R_4$ is hydrogen or an alkyl group having 1 to 4 carbon atoms, $R_5$ is hydrogen or $CF_3$ and $R_6$ is hydrogen,

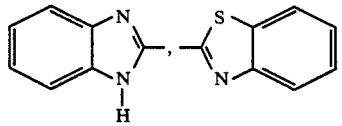

—CN, —COCH$_3$ or —CO$_2$C$_2$H$_5$, the admixture being dissolved in a substituted phenol solvent having the formula

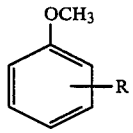

where R is hydrogen, —CH$_3$ or —OCH$_3$.

The substituted phenol solvents used in the practice of the present invention generally have a boiling point in the range of 110°–210° C. and preferably about 130° to about 170° C. in order to provide the desired evaporation rate for controlling application of the underlayer film.

As will hereinafter be further illustrated by the practice of the present invention, use of the polyimide formulations of the present invention dissolved in substituted phenol solvents substantially eliminates edge pull back. The incorporation of a dye of the coumarin type in the polyimide formulation provides an underlay composition having improved thermal stability due to higher thermal stability of this class of dye.

DETAILED DESCRIPTION OF THE INVENTION

Thermoplastic polyimide polymer compositions of the XU 218 type are preferred in the practice of the present invention. Other polyimide compositions which may be used in the practice of the present invention include the condensation product of pyromellitic dianhydride and DAPI, the condensation product of pyromellitic anhydride and a mixture of DAPI and dimethylene and the condensation product of benzophenone tetracarboxyl dianhydride and a mixture of DAPI and methylene dianiline.

Coumarin dyes which are useful in the practice of the present invention have an absorptive maximum between 250 and 550 nm and include: Coumarin 6, Coumarin 30, Coumarin 152, Coumarin 153, Coumarin 314, Coumarin 334, Coumarin 337, Coumarin 355 and bis-3,3'(7-diethylamino) coumarin. A coumarin dye particularly useful in the practice of the present invention is Oracet Yellow 8GF, otherwise known in the art as Coumarin 7.

Suitable substituted phenol solvents useful in the practice of the present invention include anisole and dimethyoxy benzene.

In practice, it has been observed that during spin coating application of the polyimide formulations of the present invention to a semiconductor substrate, thin strands or whiskers of coating material may form on the edge of the substrate. The formation of whiskers is undesirable because the whiskers may break off during spin coating and fall back on the wafer, causing contamination and thereby reduce product yields. The formation of whiskers on the edge of the substrate during spin coating may be avoided by incorporating a low boiling (i.e. about 70° to about 150° C.) liquid organic compound into the solvent portion of the present invention. The low boiling organic liquid comprises about 1 to about 15 percent by weight and preferably about 5 to about 10 percent by weight of the total solvent used to prepare the compositions of the present invention. The low boiling organic liquid is selected from substituted aromatic hydrocarbons such as xylene, toluene and ethyl benzene ethers such as tetrahydrofuran and dixoane and aliphatic ketones. The preferred boiling point range for the low boiling point organic compound is from about 100° C. to about 130° C. Further, if desired, polar solvents having a boiling point greater than 160° C., generally 160° to 200° C., such as amides, lactones and ketones may be used in combination with the substituted phenol solvent. Examples of these polar solvents include dimethyl formamide, gamma-butyrolactone and N-methyl-pyrrolidone. The advantage of using ancillary solvents such as gamma-butyrolactone is that they have a higher boiling point (160° C.–200°C.) than the substituted phenol solvent which prevents the deposited film from drying too fast. The ancillary solvent may be used in combination with the substituted phenol solvent at a weight ratio of about 50:50 to 90:10 and preferably about 70:30.

The compositions of the present invention are prepared by mixing the thermoplastic polyimide polymer with the coumarin dye in the substituted phenol solvent or mixture of the substituted phenol solvent with a polar solvent and low boiling organic liquid compound as described above. Generally the film solutions of the present invention contain from about 10 to about 20 percent by weight of the polyimide resin. Generally, the coumarin dye will be present in the formulation at concentrations of about 0.1 to about 1% by weight based on the weight of the solution or about 1 to about 3 percent by weight of the total solids. The quantity of substituted phenol solvent or mixture of solvents and the composition of the mixture are selected to obtain the specific thickness and coating quality desired in accordance with known coating techniques.

The compositions of the present invention may be employed as lift-off films or masking films which are coated on a suitable support by any customary procedure, as by spin coating, dipping, brushing, rolling spraying and the like. The particular technique employed depends on the consistency, viscosity and solids content of the solution. Spin coating at 2000 to 10,000 rpm for 1 to 90 seconds has been found to be acceptable and results in a uniform lift-off layer. When used as a lift-off film composition of the present invention the thickness of the on the support may range from about 0.5 to about 8 microns and for most lift-off processes a thickness of about 1.5 to about 2.5 microns is preferred. When used as a masking film, the thickness of the deposited film depends on the etch procedure employed as is well known to the art.

In practice, when the composition of the present invention is used as a lift-off film, the solution of lift-off film material is applied, as an underlay film, by spin coating, on a semiconductor substrate. The thickness of the layer is controlled by the viscosity of the material deposited on the substrate and the rate at which it is spun during the deposition. Typically, the thickness is in the range of 1.5 to 2.5 microns, and preferably from about 1.8 to 2.0 microns when used in integrated circuit applications.

In the fabrication of integrated circuits, the substrate may be a semiconductor material or a semiconductor substrate having a surface layer of an electrically insulative material, such as silicon dioxide or silicon nitride ($Si_3N_4$). In a typical multilayer process, the substrate is first coated with an adhesion promoter such as an aminosilane which is applied using standard spin coating or dip coating techniques. Subsequently, the polyimide underlay formulation is applied to the substrate, and the coated substrate or wafer is allowed to dry. When anisole is used as the solvent in the polyimide lift-off film layer formulations of the present invention, the solvent is sufficiently volatile (b.p. 154° C.) that an intermediate drying step before application of a photoresist layer is unnecessary and successive coatings may be applied to the polyimide underlay without drying. However, a 200° C. bake for 10 minutes is typically used to drive off any residual solvent. A barrier layer or resin glass (typically a siloxane) is applied over the polyimide underlayer using spin coating techniques. The resin-glass layer is baked typically at 200° C. for a period ranging from 10–30 minutes. Thereafter a photosensitive material is applied as the photoresist over the surface of the resin-glass barrier layer. The overlying photoresist layer is then exposed to a suitable source of radiation, such as ultraviolet, in a pattern of light corresponding to the desired preselected configuration on the substrate. The exposed areas of the photoresist layer are developed using an aqueous base developer to provide a pattern. The pattern is transferred through the barrier layer of resin-glass using a $CF_4$ plasma etch. Subsequently, the pattern is transferred through the polyimide underlayer using oxygen ion reactive etching. Both the $CF_4$ plasma and oxygen reaction ion etching are performed using commercially available equipment in a manner known to the art.

In alternative multilayer processes for the fabrication of integrated circuits using the polyimide underlay films of the present invention, a barrier layer is not employed, and the photoresist is applied directly over the polyimide layer. In these alternative multilayer processes either the photoresist composition is formulated to be more etch resistant than the polyimide underlayer so that after exposure and development of the pattern, reactive ion etching is used to transfer the pattern through the polyimide underlayer or the photoresist film is silyated to impart etch resistance to the photoresist prior to reactive ion etching development of the polyimide underlayer.

After the formation of the aperture pattern, a thin metallic film is deposited, as by vacuum deposition, at a temperature of 100° to 300° C. on the photoresist layers and the substrate through the apertures etched in the photoresist and polyimide underlay. The metal may be any metal conventionally used for integrated circuit metallization, that is, aluminum-copper alloys, copper, chromium, silver, tantalum, gold and combinations thereof. The thin metallic films generally have a thickness in the order of 0.5 to 1.0 micron.

After deposition of the thin metallic film, the polyimide underlay of the present invention can be readily and rapidly removed by conventional lift-off techniques as by imersion in a solvent which dissolves or swells the polyimide layer without affecting the thin metallic film. Suitable solvents include, acetone, butyl acetate, trichloroethylene and cellosolve acetate. A preferred lift-off technique is to immerse the substrate in a solvent such as N-methyl-2-pyrrolidinone for about 5 to 10 minutes. Ultrasonic agitation conventionally used in lift-off processing is not required in the present process. Removal of the deposited layers leaves a thin metal film in the desired preselected configuration on the substrate.

The present invention is illustrated by the following Examples:

EXAMPLE I

A polyimide formulation to prepare an underlay film for use in a lift-off process was prepared by dissolving a mixture of 15% by weight XU 218 and 5% by weight Oracet Yellow 8GF in a solvent mixture comprised of anisole and gamma-butyrolactone at an anisole:butyrolactone weight ratio of 70:30. Oracet Yellow 8GF has the formula

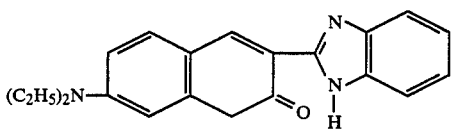

A series of quartz discs were spin coated with the polyimide formulation and then baked for 10 minutes at 100° C. followed by 30 minutes at 240° C. to prepare a 1.9 micron thick polyimide film on the quartz disc. The ultraviolet absorbance of the baked films was measured with a uv-visible spectrophotometer and is recorded in Table I below.

For purposes of comparison, the procedure of Example I was repeated with the exception that a polyimide formulation consisting of an admixture of 15% by weight XU 218 and 5% by weight Orasol 4GN dissolved in gamma-butyrolactone was used as the underlay formulation. The ultraviolet absorbance of these comparative baked films is also recorded in Table I.

TABLE I

ULTRAVIOLET ABSORBANCE

| Dye Component | 100° C./10 min. | Bake Conditions 240° C./30 min. |
|---|---|---|
| Oracet Yellow 8GF wavelength | | |
| 440 nm | 1.37 | — |
| 438 nm | — | 1.28 |
| Orasol Yellow 4GN wavelength | | |
| 434 nm | 0.573 | — |
| 422 nm | — | 0.554 |

The data recorded in Table I indicate that the optical density of the baked films prepared from Oracet Yellow 8GF dyed polyimides is more than twice that of the Orasol Yellow 4GN dyed polyimide.

EXAMPLE II

The thermal stability of the Oracet Yellow 8GF and Orasol Yellow 4GN dyes, in powdered form, were analyzed using thermo-gravimetric analysis (TGA) isothermally at 240° C. The TGA results are recorded in Table II below, for purposes of comparison

TABLE II

| Dye Component | % of Original Weight Remaining After Thermal Exposure (Minutes) | | | |
|---|---|---|---|---|
| | 30 min. | 80 min. | 100 min. | 140 min. |
| Oracet Yellow 8GF | 99.5 | 98.5 | 98.0 | 96.0 |
| Orasol Yellow 4GN | 96.5 | 70.0 | 62.0 | 60.0 |

The data recorded in Table II demonstrate the substantially greater thermal stability of the Oracet 8GF dye as compared to the Orasol Yellow 4GN dye.

EXAMPLE III

A series of nitride coated wafers were spin coated with a polyimide formulation prepared in Example I containing 4% by weight of the Oracet dye and having incorporated therein 10% by weight xylene. After spin coating the wafers were baked at 200° C. for 10 minutes and 230° C. for 30 minutes to prepare a 2.0 micron thick polyamide film on the wafer substrate. No edge pull back or formation of whiskers was evident.

Following the application of the polyimide underlayer, an etch resistant barrier layer of resin-glass siloxane was spin coated over the polyimide underlayer following the procedure of U.S. Pat. No. 4,004,044 and the wafer baked at 200° C. for 10 minutes. Thereafter a conventional photoresist composition comprised of an admixture of a novolak-type-phenol-formaldehyde resin and a photosensitive cross-linking agent was spin coated on the baked polyimide layer and baked at 80° C. The wafers were then exposed in an ultraviolet light exposure apparatus at a wavelength of 436 nm through a metal mask having a pattern of 3 micron wide bars separated by 2 micron spaces. The exposed photoresist was developed using an aqueous base developer and standard wet development technique. The developed photoresist pattern was transferred through the resin-glass siloxane barrier using a $CF_4$ plasma etchant using commercially available etching equipment and techniques. The pattern was subsequently transferred through the polyimide underlayer using standard oxygen reactive ion etching techniques. The wafers with multilayer masking were then vacuum metallized with an aluminum-copper alloy. Lift off was accomplished by immersing the metallized wafers in N-methyl-2-pyrrolidinone at about 135° C. The metal coating was lifted off from the wafer substrate within 70 minutes.

The substrates were examined under a microscope (100× magnification) and found to be free of unlifted metal.

Photomicrographs taken at 5000× magnification indicated that the metal lines had good resolution and fidelity to mask dimensions and were substantially free of linewidth variation. While specific components of the present system are defined above, many other variables may be introduced which may in any way affect, enhance, or otherwise improve the system of the present invention. These are intended to be included herein.

Although variations are shown in the present application, many modifications and ramifications will occur to those skilled in the art upon a reading of the present disclosure. These, too, are intended to be included herein.

We claim:

1. A composition for use in a process for the deposition of patterned thin metal films on substrates, the composition comprising an admixture of thermoplastic polyimide resin and a coumarin dye having the formula

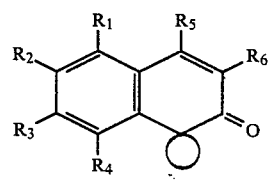

wherein $R_1$ is hydrogen, $R_2$ is hydrogen or an alkyl group having 1 to 4 carbon atoms, $R_3$ is —NHR where R is an alkyl group having 1 to 4 carbon atoms or —N$(C_2H_5)_2$, $R_4$ is hydrogen or an alkyl group having 1 to 4 carbon atoms, $R_5$ is hydrogen or —$CF_3$ and $R_6$ is hydrogen —CN, —COCH$_3$ —CO$_2$C$_2$H$_5$

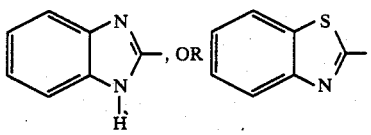

the polyimide resin and the coumarin dye admixture being dissolved in a solvent containing a substituted phenol having the formula

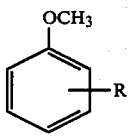

wherein R is hydrogen, —CH$_3$ or —OCH$_3$.

2. The composition of claim wherein the solvent is a mixture of the substituted phenol and a polar solvent having a boiling point greater than 160° C. selected from the group consisting of amides, lactones and ketones.

3. The composition of claim 2 wherein the solvent contains the substituted phenol and polar solvent at a weight ration of about 50:50 to about 90:10.

4. The composition of claim 1 wherein the substituted phenol is anisole.

5. The composition of claim 2 wherein the polar solvent is gamma-butyrolactone.

6. The composition of claim 1 wherein the coumarin dye is present in the admixture at a concentration of about 0.1 to about 1 percent by weight.

7. The composition of claim 1 wherein the polyimide resin is the condensation product of benzophenone-tetracarboxylic dianhydride and 5(6)-amino-1-(4'aminophenyl)-1,3,3-trimethylindane.

8. The composition of claim 1 wherein the coumarin dye has the formula

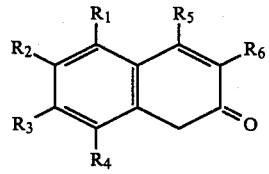

wherein R$_1$, R$_2$, R$_4$ and R$_5$ are hydrogen, R$_3$ is N(C$_2$H$_5$)$_2$ and R$_6$ is

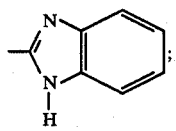

9. The composition of claim 1 wherein a liquid organic compound having a boiling point in the range of about 70° to about 150° C. selected from the group consisting of substituted aromatic hydrocarbons, ethers and aliphatic ketones is incorporated in the solvent.

10. The composition of claim 9 wherein the liquid organic compound comprises about 1 to about 15 percent by weight of the solvent.

11. The composition of claim 9 wherein the liquid organic compound is xylene.

12. A lift-off process for forming patterned thin metal films on a substrate which comprises applying to the surface of the substrate from a solution in a solvent containing a substituted phenol having the formula

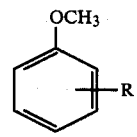

where R is hydrogen, —CH$_3$ or —OCH$_3$ a first layer comprising a thermoplastic polyimide resin in admixture with a coumarin dye having the formula

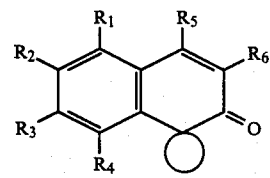

wherein R$_1$, is hydrogen, R$_2$ is hydrogen or an alkyl group having 1 to 4 carbon atoms, R$_3$ is —NHR where R is an alkyl group having 1 to 4 carbon atoms or —N(C$_2$H$_5$)$_2$, and R$_4$ is hydrogen or an alkyl group having 1 to 4 carbon atoms, R$_5$ is hydrogen or —CF$_3$ and R$_6$ is hydrogen, —CN, —COCH$_3$, —CO$_2$C$_2$H$_5$,

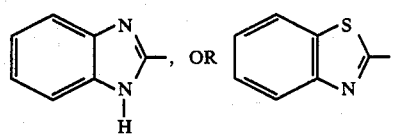

forming on the first layer a photoresist layer,
exposing the photoresist layer to a selected pattern of ultraviolet light,
developing the photoresist,
forming openings in the photoresist and openings through the first layer having a pattern complementary to the openings in the photoresist layer,
depositing a thin metal film onto the substrate through the complementary openings and then
removing the first layer to lift-off the photoresist layer and any excess thin film material to leave a thin metal film pattern on the substrate.

13. The process of claim 12 wherein the photoresist is silyated prior to forming openings in the photoresist.

14. The process of claim 12 wherein a barrier layer of resin glass is applied to the photoresist layer and etched with CF$_4$ prior to forming openings in the photoresist layer.

15. The process of claim 12 wherein the coumarin dye is present in the admixture at a concentration of about 1 to about 3 percent by weight based on the weight of the polyimide resin.

16. The process of claim 12 wherein the polyimide resin is the condensation product of benzo-phenonetetracarboxylic anhydride and 5(6)-amino-1-(4'aminophenyl)-1,3,3-trimethylindane.

17. The process of claim 9 wherein the coumarin dye has the formula

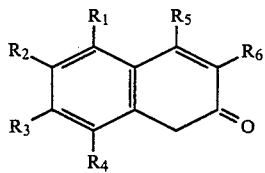

wherein $R_1$, $R_2$, $R_4$ and $R_5$ are hydrogen, $R_3$ is $N(C_2H_5)_2$ and $R_6$ is

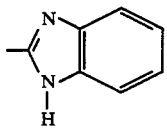

18. The process of claim 12 wherein the substituted phenol is anisole.

19. The process of claim 12 wherein the solvent is a mixture of the substituted phenol and a polar solvent having a boiling point greater than 160° C. selected from the group consisting of amides, lactones and ketones.

20. The process of claim 19 wherein the solvent contains the substituted phenol and polar solvent at a weight ratio of about 50:50 to about 90:10.

21. The process of claim 19 wherein the polar solvent is gamma-butyrolactone.

22. The process of claim 12 wherein a liquid organic compound having a boiling point of about 70° to about 150° C. selected from the group consisting of substituted aromatic hydrocarbons, ethers and aliphatic ketones is incorporated in the solvent.

23. The process of claim 22 wherein the liquid organic compound is xylene.

24. The process of claim 22 wherein the liquid organic compound comprises about 1 to about 15 percent by weight of the solvent.

* * * * *

UNITED STATES PATENT AND TRADEMARK OFFICE
CERTIFICATE OF CORRECTION

PATENT NO. : 4,828,964
DATED : May 9, 1989
INVENTOR(S) : Brunsvold et al.

Page 1 of 2

It is certified that error appears in the above—identified patent and that said Letters Patent is hereby corrected as shown below:

Col. 3, line 40; col. 9, line 45 and col. 11, line 5, correct the structure

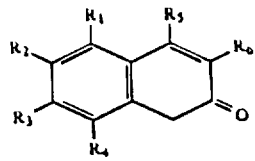     to read     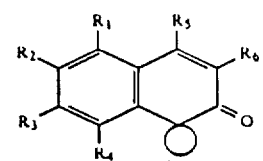

Col. 7, line 5 correct the structure

UNITED STATES PATENT AND TRADEMARK OFFICE
CERTIFICATE OF CORRECTION

PATENT NO. : 4,828,964

DATED : May 9, 1989

INVENTOR(S) : Brunsvold et al

It is certified that error appears in the above-identified patent and that said Letters Patent is hereby corrected as shown below:

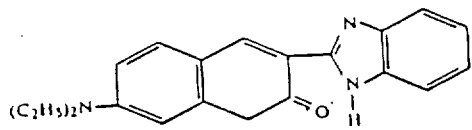   to read   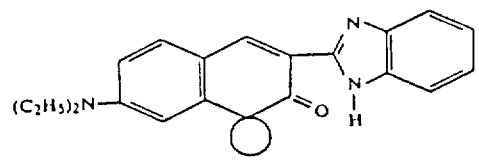

Signed and Sealed this

Tenth Day of October, 1989

Attest:

DONALD J. QUIGG

Attesting Officer

Commissioner of Patents and Trademarks

UNITED STATES PATENT AND TRADEMARK OFFICE
CERTIFICATE OF CORRECTION

PATENT NO. : 4,828,964
DATED : May 9, 1989
INVENTOR(S) : Brunsvold, et al.

It is certified that error appears in the above-identified patent and that said Letters Patent is hereby corrected as shown below:

Col. 3, line 40; col. 9, line 45 and col. 11, line 5, correct the structure:

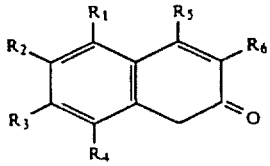    to read    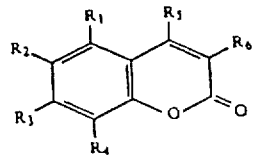

Col. 7, line 5, correct the structure:

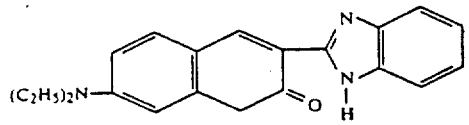    to read    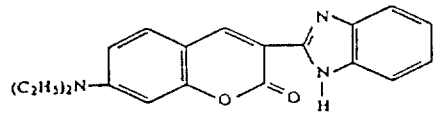

UNITED STATES PATENT AND TRADEMARK OFFICE
CERTIFICATE OF CORRECTION

PATENT NO. : 4,828,964

DATED : May 9, 1989

INVENTOR(S) : Brunsvold, et al.

It is certified that error appears in the above-identified patent and that said Letters Patent is hereby corrected as shown below:

Col. 8, line 57 and col. 10, line 22, correct the structure:

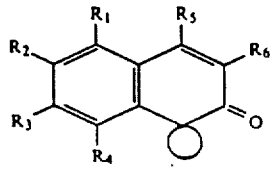   to read   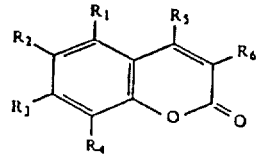

This certificate supersedes Certificate of Correction issued October 10, 1989.

Signed and Sealed this

Twentieth Day of February, 1990

*Attest:*

JEFFREY M. SAMUELS

*Attesting Officer*   *Acting Commissioner of Patents and Trademarks*